United States Patent
Klinkhamer et al.

(10) Patent No.: US 12,449,735 B2
(45) Date of Patent: Oct. 21, 2025

(54) SUB-FIELD CONTROL OF A LITHOGRAPHIC PROCESS AND ASSOCIATED APPARATUS

(71) Applicant: ASML NETHERLANDS B.V., Veldhoven (NL)

(72) Inventors: Jacob Fredrik Friso Klinkhamer, Tilburg (NL); Valerio Altini, Eindhoven (NL); Hans Erik Kattouw, Arnhem (NL); Theo Wilhelmus Maria Thijssen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 651 days.

(21) Appl. No.: 17/639,631

(22) PCT Filed: Aug. 6, 2020

(86) PCT No.: PCT/EP2020/072107
§ 371 (c)(1),
(2) Date: Mar. 2, 2022

(87) PCT Pub. No.: WO2021/047833
PCT Pub. Date: Mar. 18, 2021

(65) Prior Publication Data
US 2022/0334499 A1 Oct. 20, 2022

(30) Foreign Application Priority Data

Sep. 10, 2019 (EP) ..................................... 19196357
Sep. 16, 2019 (EP) ..................................... 19197575

(51) Int. Cl.
*G03F 7/00* (2006.01)

(52) U.S. Cl.
CPC ...... *G03F 7/70266* (2013.01); *G03F 7/70258* (2013.01); *G03F 7/70625* (2013.01); *G03F 7/70725* (2013.01)

(58) Field of Classification Search
CPC ............. G03F 7/70258; G03F 7/70625; G03F 7/70725; G03F 7/70266; G03F 7/70633;
(Continued)

(56) References Cited

U.S. PATENT DOCUMENTS

| | | |
|---|---|---|
| 2003/0035090 A1 | 2/2003 | Imai et al. |
| 2006/0033921 A1 | 2/2006 | Den Boef et al. |

(Continued)

FOREIGN PATENT DOCUMENTS

| | | |
|---|---|---|
| EP | 1037266 | 9/2000 |
| EP | 3343294 | 7/2018 |

(Continued)

OTHER PUBLICATIONS

Office Action issued in Japanese Patent Application No. 2022-510910, dated Mar. 10, 2023.

(Continued)

*Primary Examiner* — Christina A Riddle
(74) *Attorney, Agent, or Firm* — Pillsbury Winthrop Shaw Pittman, LLP (57) ABSTRACT

A method for determining a correction for control of a lithographic process for exposing a pattern on an exposure field using a lithographic apparatus. The method including obtaining a spatial profile describing spatial variation of a performance parameter across at least a portion of the exposure field and co-determining control profiles for the spatial profile to minimize error in the performance parameter while ensuring a minimum contrast quality. The co-determined control profiles include at least a stage control profile for control of a stage arrangement of the lithographic (Continued)

apparatus and an optical element (e.g., lens) manipulator control profile for control of an optical element manipulator of the lithographic apparatus, the manipulator operable to perform a correction for at least magnification in a direction perpendicular to the substrate plane.

20 Claims, 5 Drawing Sheets

(58) Field of Classification Search
CPC ............ G03F 7/70141; G03F 7/70191; G03F 7/70316; G03F 7/70308; G03F 7/70325; G03F 7/70483–70508; G03F 7/70533; G03F 7/7055; G03F 7/70591–706; G03F 7/70641; G03F 7/70716; G03F 7/70758; G03F 7/70775; G03F 7/70825; G03F 7/70605–706851
USPC .... 355/18, 30, 52–55, 67–77, 133; 430/5, 8, 430/22, 30
See application file for complete search history.

(56) References Cited

U.S. PATENT DOCUMENTS

| | | |
|---|---|---|
| 2006/0066855 A1 | 3/2006 | Boef et al. |
| 2008/0128642 A1 | 6/2008 | Mos et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2011/0216294 A1* | 9/2011 | Menchtchikov .... G03F 7/70258 355/53 |
| 2012/0008127 A1 | 1/2012 | Tel et al. |
| 2012/0044470 A1 | 2/2012 | Smilde et al. |
| 2012/0123581 A1 | 5/2012 | Smilde et al. |
| 2013/0230797 A1 | 9/2013 | Van Der Sanden et al. |
| 2013/0258310 A1 | 10/2013 | Smilde et al. |
| 2013/0271740 A1 | 10/2013 | Quintanilha |
| 2016/0299436 A1 | 10/2016 | Rist |
| 2018/0164687 A1 | 6/2018 | Kim et al. |
| 2018/0292761 A1 | 10/2018 | Cekli et al. |
| 2021/0096472 A1 | 4/2021 | Altini et al. |

FOREIGN PATENT DOCUMENTS

| | | |
|---|---|---|
| EP | 3547029 | 10/2019 |
| EP | 3680714 | 7/2020 |
| EP | 3734366 | 11/2020 |
| JP | 2016200818 | 12/2016 |
| JP | 2017199031 | 11/2017 |
| JP | 2018508049 | 3/2018 |
| NL | 2021296 | 9/2018 |
| TW | 201024926 | 7/2010 |
| TW | 201530267 | 8/2015 |
| WO | 2003093903 | 11/2003 |
| WO | 2007007626 | 1/2007 |
| WO | 2009078708 | 6/2009 |
| WO | 2009106279 | 9/2009 |
| WO | 2013178422 | 12/2013 |
| WO | 2016142169 | 9/2016 |
| WO | 2016146217 | 9/2016 |
| WO | 2018134010 | 7/2018 |
| WO | 2019110261 | 6/2019 |
| WO | WO-2019185230 A1 * | 10/2019 ......... G03F 7/70066 |

OTHER PUBLICATIONS

Office Action issued in Korean Patent Application No. 10-2022-7008039, dated Mar. 28, 2024.
Office Action issued in corresponding Japanese Patent Application No. 2022-510910, dated Aug. 4, 2023.
International Search Report and Written Opinion issued in corresponding PCT Patent Application No. PCT/EP2020/072107, dated Nov. 6, 2020.
Taiwanese Office Action issued in corresponding Taiwanese Patent Application No. 109129081, dated Aug. 4, 2021.

* cited by examiner

SUB-FIELD CONTROL OF A LITHOGRAPHIC PROCESS AND ASSOCIATED APPARATUS

CROSS-REFERENCE TO RELATED APPLICATIONS

This application is the U.S. national phase entry of PCT Patent Application No. PCT/EP2020/072107 which was filed on Aug. 6. 2020, which claims the benefit of priority of European Patent Application No. 19196357.8 which was filed on Sep. 10, 2019 and of European Patent Application No. 19197,575.4 which was filed on Sep. 16, 2019 which are incorporated herein in their entireties by reference.

FIELD OF INVENTION

The present invention relates to methods and apparatus for applying patterns to a substrate in a lithographic process and/or measuring said patterns

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Currently the overlay error is controlled and corrected by means of correction models described for example in US2013230797A1. Advanced process control techniques have been introduced in recent years and use measurements of metrology targets applied to substrates alongside the applied device pattern. These targets allow overlay to be measured using a high-throughput inspection apparatus such as a scatterometer, and the measurements can be used to generate corrections that are fed back into the lithographic apparatus when patterning subsequent substrates. Examples of advanced process control (APC) are described for example in US2012008127A1. The inspection apparatus may be separate from the lithographic apparatus. Within the lithographic apparatus wafer correction models are conventionally applied based on measurement of overlay targets provided on the substrate, the measurements being as a preliminary step of every patterning operation. The correction models nowadays include higher order models, to correct for non-linear distortions of the wafer. The correction models may also be expanded to take into account other measurements and/or calculated effects such as thermal deformation during a patterning operation While the use of higher order models may be able take into account more effects, however, such models may be of limited use, if the patterning apparatus itself does not provide control of corresponding parameters during patterning operations. Furthermore, even advanced correction models may not be sufficient or optimized to correct for certain overlay errors.

It would be desirable to improve such process control methods.

SUMMARY OF THE INVENTION

In a first aspect of the invention, there is provided a method for determining a correction for control of a lithographic process for exposing a pattern on an exposure field using a lithographic apparatus, the method comprising: obtaining a spatial profile describing spatial variation of a performance parameter across at least a portion of the exposure field; and co-determining control profiles for the spatial profile to minimize error in the performance parameter while ensuring a minimum contrast quality, said co-determined control profiles comprising at least a stage control profile for control of a stage arrangement of the lithographic apparatus and a lens manipulator control profile for control of a lens manipulator of the lithographic apparatus operable to perform a correction for at least magnification in a direction perpendicular to the substrate plane.

In a second aspect of the invention, there is provided a computer program comprising program instructions operable to perform the method of the first aspect when run on a suitable apparatus.

In a third aspect of the invention, there is provided a lithographic apparatus comprising: an illumination system for providing a beam of radiation; a stage arrangement comprising a first stage for supporting a patterning device, the patterning device serving to impart the radiation beam with a pattern in its cross-section and a second stage for holding a substrate; a projection system for projecting the patterned radiation beam onto a target portion of the substrate; a lens manipulator configured to impose a correction on the patterned radiation beam in accordance with a lens manipulator control profile, the lens manipulator being located proximate a field plane; and, a controller configured to perform the method of the first aspect.

In a fourth aspect of the invention there is provided a method of performing co-determined stage control and dynamic lens control for control of a lithographic process for exposing a pattern on an exposure field using a lithographic apparatus, the method comprising: co-determining a stage control profile configured to correct one or more spatially varying performance parameters and a dynamic lens control profile to stabilize the impact of said stage control on contrast with minimal impact on said one or more performance parameters.

In a fifth aspect of the invention there is provided a method of determining a stage control profile for a stage within a lithographic apparatus used in projecting an image of a pattern to a substrate, the method comprising: obtaining a spatial variation across at least a part of the substrate of a position parameter associated with the positioning of the projected image; and determining the control profile for the stage based on the spatial variation of the position parameter and a correction potential of a lens manipulator used in stabilizing or mitigating image contrast degradation due to the expected impact of a dynamic stage position error associated with the stage control profile configured to correct the spatial variation of the position parameter.

Ina sixth aspect of the invention there is provided a method of determining a dynamic control profile for a manipulator of a lens within a lithographic apparatus used in projecting an image of a pattern to a substrate, the method comprising: obtaining a spatial variation across at least a part of the substrate of a position parameter associated with the positioning of the projected image; and determining the dynamic control profile for the manipulator based on a desired stabilization or mitigation of image contrast degradation due to the expected impact of a dynamic stage position error associated with a stage control profile configured to correct the spatial variation of the position parameter.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
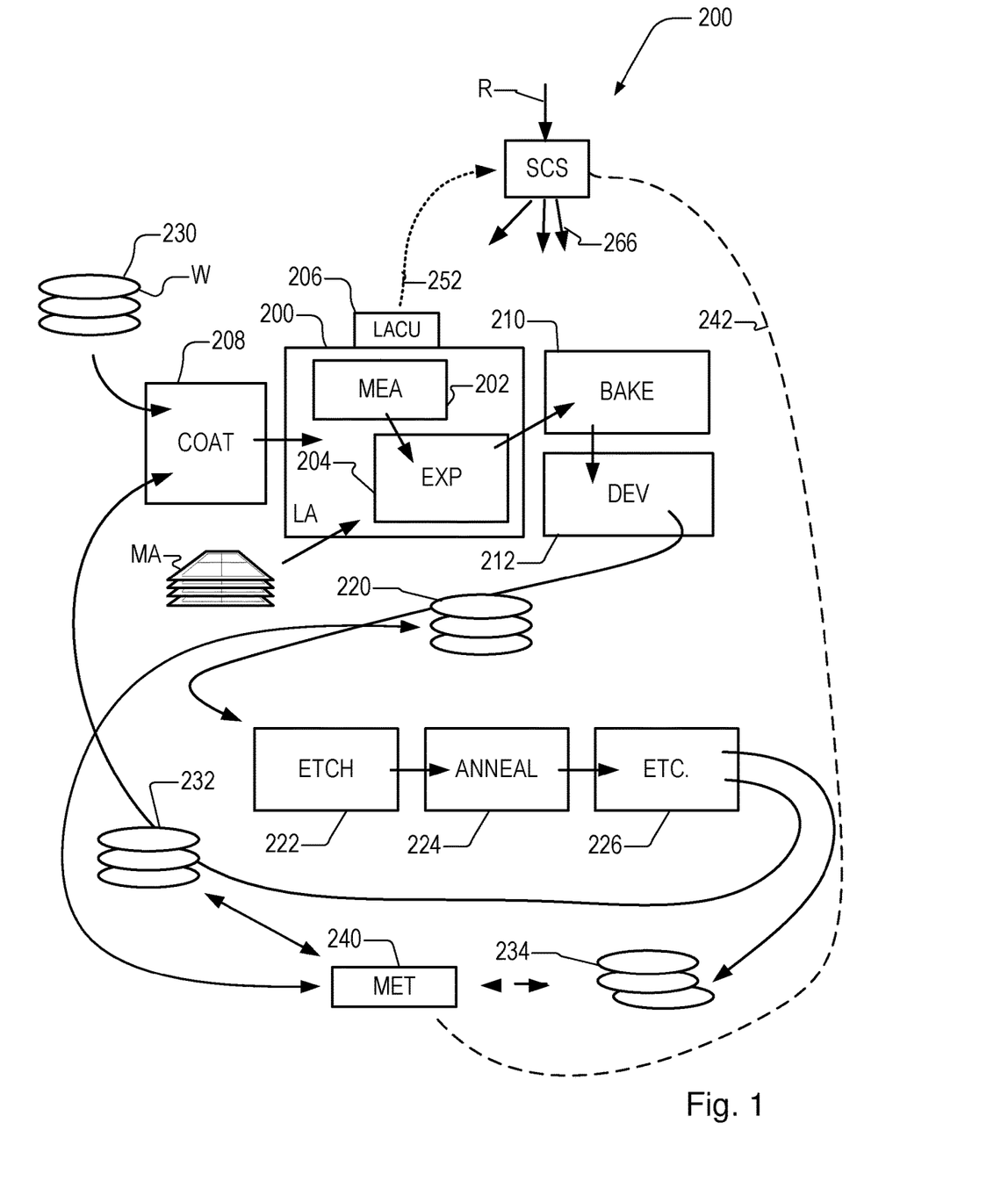
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station— between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200.

At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc.. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figure 2:
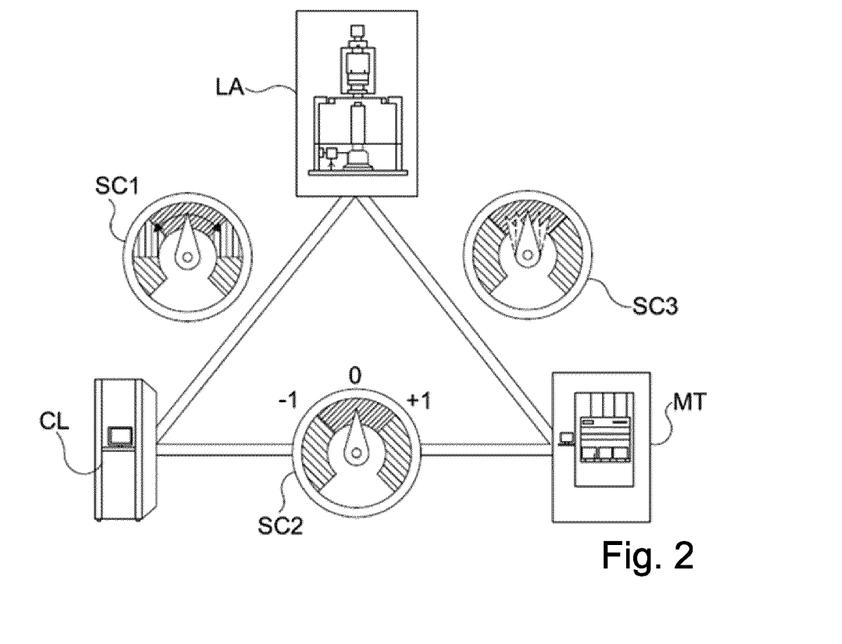
FIG. 2 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 2. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 2 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 2 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 2 by the multiple arrows in the third scale SC3).

Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In another words, these individual patterns limit the OPW. These individual patterns can be referred to as "hot spots" "critical features" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

Figure 3:
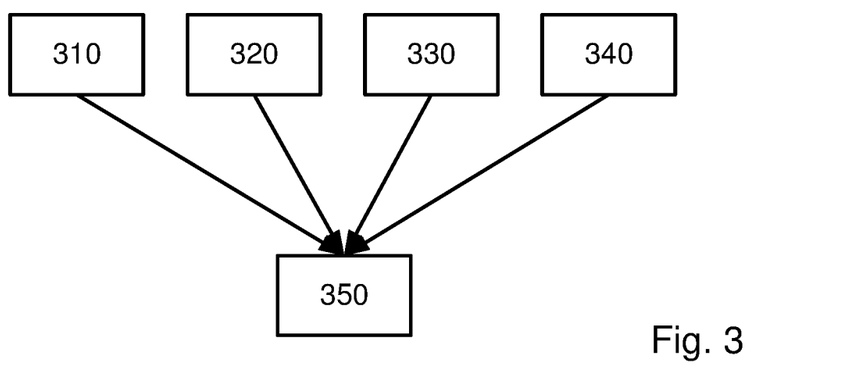
FIG. 3 shows exemplary sources of processing parameters.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Control of the lithographic process are typically based on measurements fed back or fed forward and then modelled using, for example interfield (across-substrate fingerprint) or intrafield (across-field fingerprint) models. United States Patent Application 20180292761, which is incorporated herein by reference, describes a control method for controlling a performance parameter such as overlay at a sub-field level using an advanced correction model. Another control method using sub-field control is described in European Patent Application EP3343294A1, which is also incorporated herein by reference. Each sub-field, for example may relate to a single die or functional area thereof.

However, while an advanced correction model may, for example, include 20-30 parameters, lithographic apparatuses (the term "scanners" will be used throughout the description for brevity) currently in use may not have actuators which correspond to one or more of the parameters. Hence, only a subset of the entire set of parameters of the model can be used at any given time. Additionally, as the advanced models require many measurements, it is not desirable to use these models in all situations, since the time required to perform the necessary measurements reduces throughput.

Some of the main contributors to overlay errors include, but are not limited to, the following:

scanner-specific errors: these may arise from the various subsystems of the scanner used during exposure of the substrate, in effect creating a scanner-specific fingerprint;

process induced wafer deformation: the various processes performed on the substrates may deform the substrate or wafer;

illumination setting differences: these are caused by the settings of the illumination system, such as the shape of the aperture, lens actuator positioning, etc.;

heating effects—heating induced effects will differ between various sub-fields of a substrate, in particular for substrates wherein the various sub-fields include different types of components or structures;

reticle writing errors: errors may be present already in the patterning device due to limitations in its manufacture; and topography variations: substrates may have topography (height) variations, in particular around the edges of wafers.

Modeling overlay error of individual sub-fields of a field (e.g., at die level or other functional area level) can be carried out instead of modeling the overlay error of the field in its entirety, or it can be modeled in addition to modeling the field in its entirety. While the latter requires more processing time, since both the field as well as the sub-fields within it are modeled, it allows for the correction of error sources which relate to a particular sub-field only as well as error sources which relate to the entirety of the field. Other combinations, such as modeling the entire field and only certain sub-fields, are of course possible.

Even where an error is modelled sufficiently, actuation of a resultant correction also presents difficulties. Some corrections simply cannot be actuated effectively using the available control parameters (control knobs). Additionally, while other corrections may be actuatable, actually doing so may result in undesirable side effects. Essentially, due to dynamic and control limitations and sensitivities, there is a limit on what the scanner can actually do to implement a correction.

Figure 4:
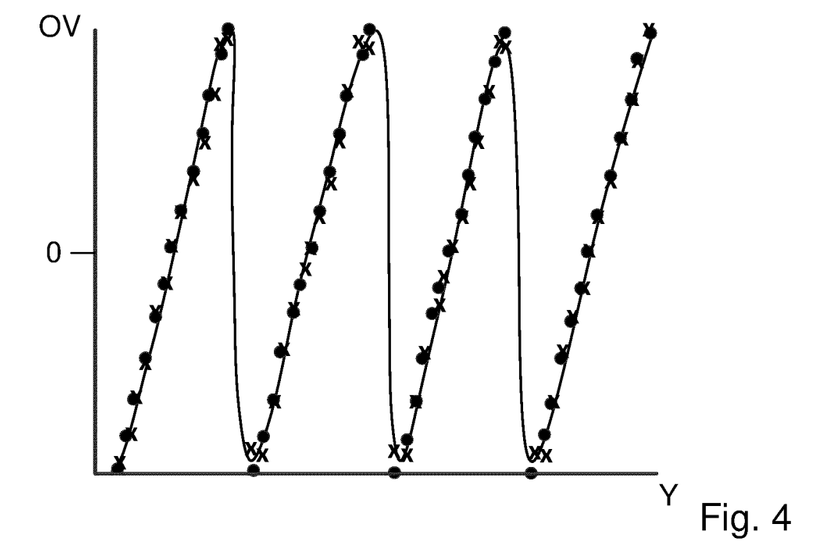
FIG. 4 is a graph of overlay against field position along a scan direction, showing measured overlay; and a fitted correction modeled and/or implemented using a control grid determined by a method according to an embodiment of the invention.

FIG. 4 illustrates a specific example of an inter-field overlay fingerprint which presents difficulty in actuating correction. It shows a graph of overlay OV (y-axis) against scan direction Y in one exposure field. Each cross represents a measured overlay value, and each dot is a necessary corresponding compensating correction. The fitted line is a (near ideal) correction profile, which is fitted to the corrections (dots). The saw tooth pattern exhibited in the overlay fingerprint is evident; with each substantially linear section corresponding to a single die (the graph representing overlay measurements across 4 dies). The correction profile follows (and therefore compensates for) the overlay fingerprint. Such a fingerprint is seen as a result of the large stresses induced by a large stack, e.g., as used in a 3D-NAND or DRAM process for example. This stress manifests itself both at wafer level (causing severe wafer warp) as well as at die level. At die level, the overlay fingerprint comprises a magnification inside each die. Since there are multiple dies within an exposure field, the resultant field overlay fingerprint exhibits the sawtooth pattern shown (typically at a scale of tens of nm). Depending on the orientation of the device, the pattern can either be through-slit or through-scan. Regardless of the orientation, this overlay pattern is challenging to correct for with available models and actuators. It should also be noted that such an overlay or edge placement error (EPE) which manifests as a sawtooth pattern (e.g., caused by intra-die stress in the 3D-NAND or DRAM process, as illustrated in FIG. 4) presents a purely exemplary specific challenge which the methods described herein aim to address; it should be appreciated that such methods can be used to correct for any other higher-order overlay, EPE or focus fingerprint (such as, for example, high-frequency intra-field fingerprints).

In order to optimally correct the overlay fingerprint as depicted in FIG. 4 it is important to be able to adjust the scanner at a spatial scale which is smaller than the pitch of a periodic profile, for example smaller than one "saw tooth" of the repeating saw tooth profile of FIG. 4. Such an individual saw tooth area is typically associated with a cell structure within an individual die. Hence the interface to the scanner should allow the definition of separately controllable areas within an exposure field. This concept is referred to as a sub-field control interface; an example of this disclosed in the aforementioned European Patent Application EP3343294A1. For example the control profile for the wafer stage of the scanner configured for a first cell die/cell structure may be defined largely independently from a control profile for a second cell/die structure positioned further along a direction of scanning. The sub-field control infrastructure allows a more optimal correction of overlay (or focus) variations being repetitive at a sub-field resolution. Further the ability to independently control different sub-field areas allows mitigation of die-to-die or cell-to-cell variations of the intra-die and/or intra-cell overlay/focus fingerprint.

Typically scanner overlay control uses dynamic stage position control to adjust placement of structures (features) such that an overlay error is minimized. In principle this may be implemented by pre-correction of an expected overlay error fingerprint (e.g., as induced by a buildup of stress due to application of a subsequent layer) and/or by adjustment of placement of features within the subsequent layer in order to sufficiently align with features in the previous layer(s). Dynamic control in the context of this document refers to a control strategy wherein the stage actuator(s) and/or lens manipulator(s) of interest are continuously adjusted during the actual exposure operation; e.g. during the exposure of patterns on the substrate.

The scanner overlay correction is typically applied by the stage controller and/or lens manipulators of the projection lens (odd aberration control may be used to control placement of features). However, as already mentioned, the scanner cannot perfectly follow any desired overlay correction profile. One reason for this is due to constraints on the speed and acceleration achievable by the wafer (and reticle) stage. Another reason is the fact that the scanner exposes the substrate with a relatively large illumination spot (the so-called slit length being representative for the size of the light spot in the scanning direction, reference: EP application EP19150960.3, which is hereby incorporated by reference in its entirety). The extension of the light spot means that some part of the features within a die/cell will always be sub-optimally positioned during the scanning exposure, in situations where the desired overlay correction is not merely a simple shift across the entire die/cell. This variation of the effective position (overlay) correction during the scanning operation effectively causes a blurring of the aerial image of the features, which in turn leads to a loss of contrast. This dynamic effect is commonly referred to as Moving Standard Deviation (MSD). The limitations on the stage positioning are typically associated with the average position (overlay) error and are commonly referred to as a Moving Average (MA) error.

More specifically, the Moving Average (MA) error and Moving Standard Deviation (MSD) of the error of a lithographic stage relates to a critical time window comprising the time interval that each point on a die is exposed (in other words: receives photons). If the average position error for a point on the die during this time interval is high (in other words: high MA-error), the effect is a shift of the exposed image, resulting in overlay errors. If the standard deviation of the position error during this time interval is high (in other words: high MSD error), the image may smear, resulting in fading errors. When following a high frequency sub-field profile accurately to achieve a small MA error, this will typically be at the cost of MSD error which destroys contrast; this defines a limit to the achievable overlay correction potential as at some point the MSD penalty becomes too great.

Both average overlay errors (MA) and contrast loss due to MSD are contributors to the overall Edge Placement Error (EPE) budget and hence need to be carefully balanced when determining a certain control profile for a wafer and/or reticle stage; typically a more MA targeted control approach will give a higher MSD impact, while an MSD targeted control strategy may lead to unacceptably large MA errors. EPE is the combined error resultant from global critical dimension uniformity (CDU), local CDU (e.g., line edge roughness LER/line width roughness LWR) and overlay error. It is these parameters which have the greatest effect on yield, as it is errors in these parameters which effect the relative positioning of features, and whether any two features unintentionally make contact or unintentionally fail to make contact.

As such, the correction and/or control profiles should be balanced such that a) the MSD characteristics associated with the control profile do not unduly deteriorate imaging quality of features and b) the MA characteristics associated with the control profile do not unduly deteriorate overlay. One way of addressing this requirement for balancing MA and MSD is to determine a maximum allowed MSD degradation, and using this maximum allowed MSD degradation as a limit or constraint when optimizing overlay/MA control.

A relatively new optical element has become available in some scanners. This optical element comprises a deformable reflector (or a pair of such deformable reflectors), sometimes referred to as a half dome mirror. The deformable reflector is disclosed in WO2018/134010 which is incorporated herein by reference. By actuating the deformable reflector to give it a particular configuration, it is possible to impose a correction profile to the patterned radiation beam (i.e., patterned by the reticle) by reflecting it with the particular configuration. The deformable reflector may be located proximate a field plane (e.g., in the projection optics) of the scanner. The shape of a wavefront of radiation reflecting from the deformable reflector may be adjusted via deformation of the deformable reflector. The wavefront may be adjusted such that a lithographic error, such as an overlay error, is reduced. The deformable reflector is advantageously capable of reducing lithographic errors that originate from a wide range of different sources. The deformable reflector is advantageously capable of reducing lithographic errors across a field plane of a lithographic apparatus. In particular, the deformable reflector provides greater flexibility in imposing in-slit corrections (corrections along the slit length) and therefore very fast manipulation of a geometrical deformation of the patterned radiation beam, such as a magnification error (when travelling along the scan direction), even at a timescale smaller than a time it takes to move the slit across a certain point on the wafer. Such a magnification error may manifest itself as a sawtooth pattern or otherwise. Other geometrical deformations than magnifications may be induced as well by the deformable reflector (or any other lens manipulator element having the same functionality), such as barrel, pincushion, moustache, chromatic aberrations, etc.

Figure 5:
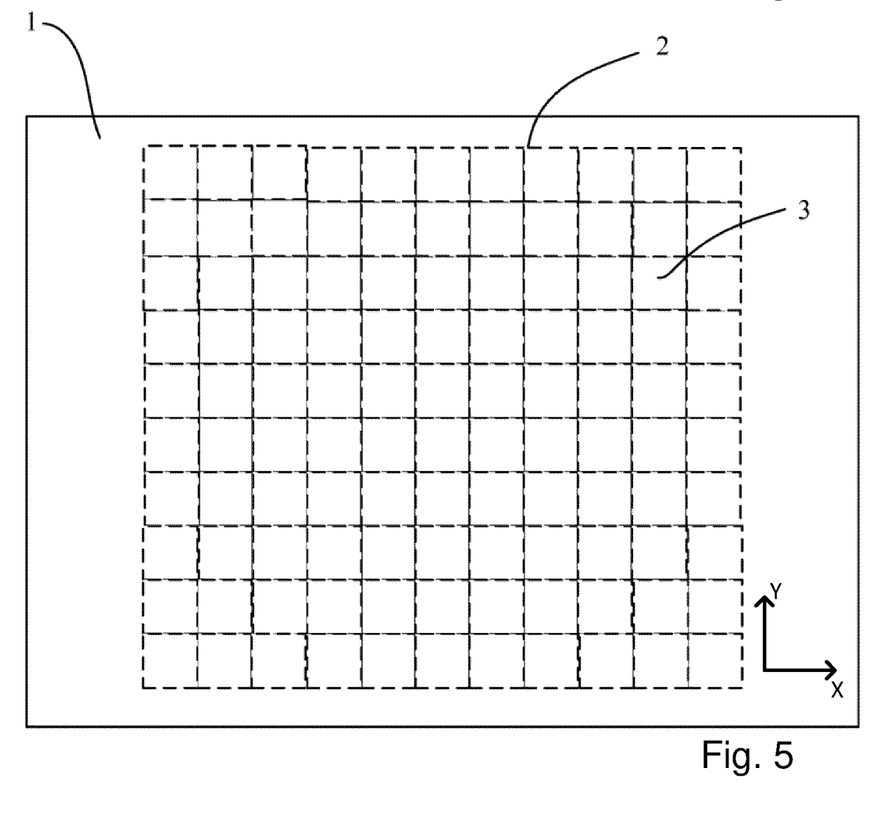
FIG. 5 schematically depicts a deformable reflector which may be used in a method according to an embodiment of the invention.

FIG. 5 schematically depicts a deformable reflector 1 according to an embodiment of the invention. In the example of FIG. 5, the deformable reflector 1 comprises a generally rectangular array of actuating elements 2. The array of actuating elements 2 may take any desired form, e.g. the array of actuating elements 2 may be generally circular. The deformable reflector 1 may comprise a larger or smaller number of actuating elements than that shown in FIG. 5. The deformable reflector 1 may, for example, comprise from about 50 actuating elements to about 200 actuating elements. Each actuating element may be configured to actuate a different portion 3 of the deformable reflector 1. In the example of FIG. 5 the actuating elements, and their corresponding portions 3, are generally square shaped. The actuating elements and the portions 3 of the deformable reflector 1 may take any desired shape, e.g. generally circular, generally rectangular, etc.. In the example of FIG. 5 the deformable reflector is generally rectangular. The deformable reflector 1 may take any desired shape, e.g. the deformable reflector 1 may be generally circular. The deformable reflector 1 may be curved or flat. The surface area of the deformable reflector 1 and/or the surface area of the array of actuating elements 2 may be selected as desired. For example, the surface area of the deformable reflector 1 and/or the array of actuating elements 2 may be dependent at least in part upon the projection system of the lithographic apparatus in which the deformable reflector 1 is located.

The actuating elements may be configured to deform portions 3 of the deformable reflector 1 such that the portions 3 of the deformable reflector 1 move in a direction normal to the surface of the deformable reflector 1 (i.e. along the z-axis). The actuating elements are configured to move the portions 3 of the deformable reflector 1 from a resting position in which the actuating element exerts no force on the portion 3 to an active position in which the actuating element exerts a force on the portion 3. The actuating elements may be configured to move the portions along the z-axis across a range of about 50 nm in the positive z direction and about 50 nm in the negative z direction, thus allowing a range of movement of about 100 nm along the z-axis. The actuating elements may, for example, be configured to move the portions along the z-axis in increments of about 0.1 nm. The actuating elements may be configured to move portions 3 of the deformable reflector 1 across greater or smaller ranges and by greater or smaller increments. As will be appreciated, the distance by which the actuating elements are able to deform the deformable reflector 1 may be determined in part by a thickness of the deformable reflector 1 and/or a material from which the deformable reflector 1 is formed. A deformable reflector that is suitable for use in an EUV lithographic apparatus may be thicker than a deformable reflector that is suitable for use in a UV lithographic apparatus.

An actuating element may, for example, comprise a piezoelectric actuator. A voltage may be applied to the piezoelectric actuator to cause deformation of the piezoelectric actuator. Deformation of the piezoelectric actuator may cause the portion 3 of the deformable reflector 1 in which the piezoelectric actuator is located to deform. Applying a greater voltage to the piezoelectric actuator may cause greater deformation of the piezoelectric actuator, and thereby greater deformation of the portion 3 of the deformable reflector 1 in which the piezoelectric actuator is located.

By actuating the actuating elements and deforming portions of the deformable reflector 1, a wavefront of radiation reflecting from the deformable reflector 1 may be adjusted. The scale of adjustment of a wavefront of which the deformable reflector 1 is capable may be determined in part by the area of the portions 3 of the deformable reflector 1 which may be deformed by the actuating elements. That is, using smaller actuating elements to deform smaller portions of the deformable reflector 1 may enable finer adjustments of a wavefront reflecting from the deformable reflector 1 than using larger actuating elements to deform larger portions of the deformable reflector 1. One actuating element may, for example, be configured to actuate a portion 3 of the deformable reflector 1 that has an area within the range of about 25 mm$^2$ to about 500 mm$^2$. In general, an actuating element may be configured to actuate a portion 3 of the deformable reflector 1 having any desired area.

The wavefront may be adjusted such that a lithographic error, such as an overlay error and/or a focus error, is reduced. In order to reduce a lithographic error, the lithographic error is first determined. The lithographic error may be determined via direct measurement (e.g. using a detector system), indirect measurement (e.g. performing a lithographic exposure in a resist and analysing the resist) and/or prediction (e.g. by inputting data into a computer model and executing the computer model). For example, data relating to lithographic errors may be measured and input into a computer model. The computer model may be configured to receive data and perform calculations using that data in order to predict a lithographic error.

Once the lithographic error has been determined, a correction profile for the patterned radiation beam may be determined. The correction profile is configured to reduce the lithographic error when the correction profile is applied to the patterned radiation beam. The correction profile may comprise modifications of a wavefront required to reduce a lithographic error. The correction profile is applied to the patterned radiation beam by actuating the actuating elements to deform portions 3 of the deformable reflector 1. Some portions 3 may not undergo deformation. Different portions may be deformed by different amounts and/or in different directions. The portions that are to be deformed and the amount of deformation to apply to those portions may be determined by a processor configured to receive the correction profile and calculate the deformations of portions of the deformable reflector 1 needed to apply the correction profile to the patterned radiation beam.

Figure 6:
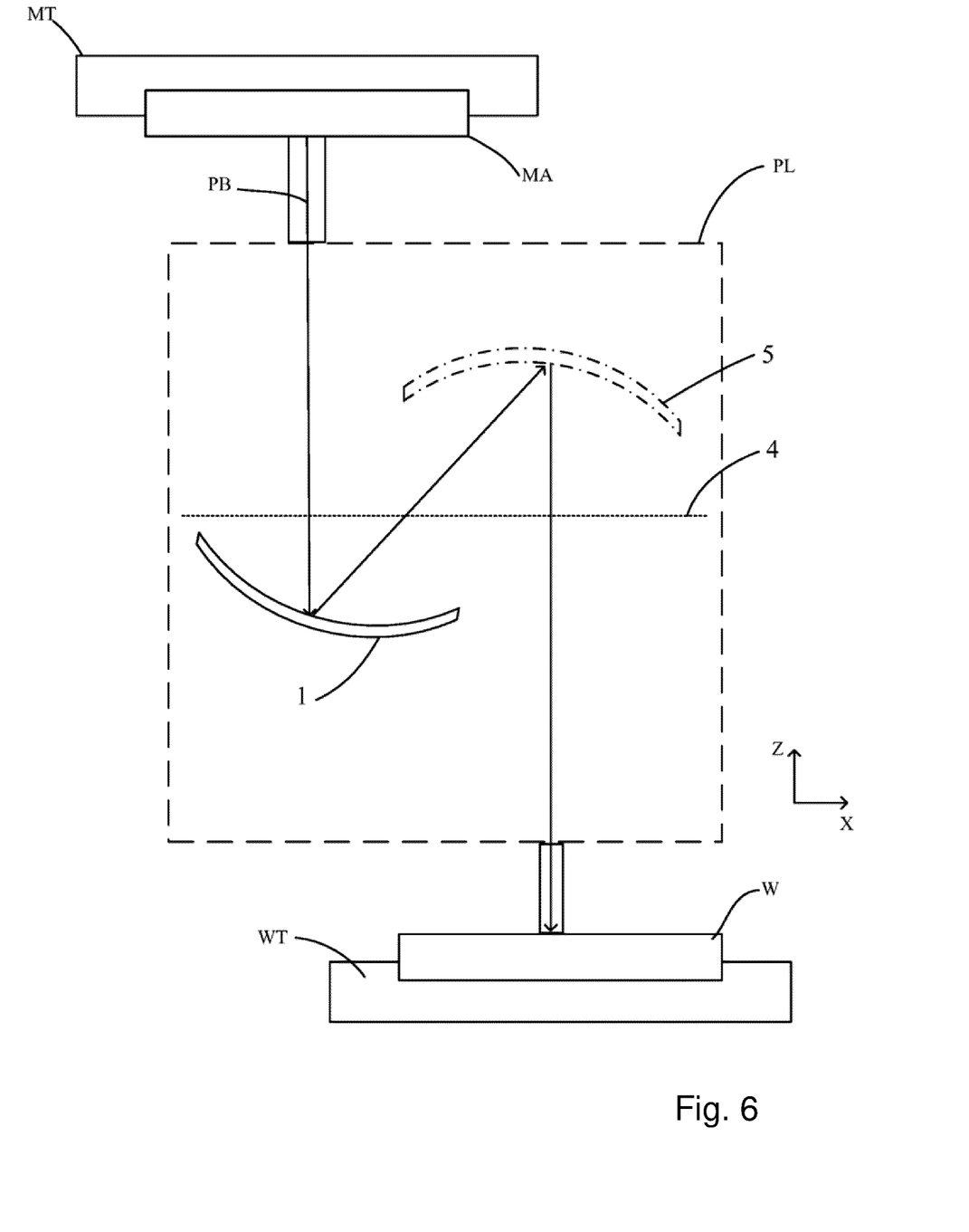
FIG. 6 schematically depicts a portion of a lithographic apparatus comprising a deformable reflector, which may be used in a method according to an embodiment of the invention.

FIG. 6 schematically depicts a portion of a lithographic apparatus comprising a deformable reflector 1. In the example of FIG. 6, the deformable reflector 1 is located within a projection system of a lithographic apparatus, such as the projection system PL of FIG. 1. The projection system PL may comprise a plurality of other optical elements such as mirrors, lenses, etc. (not shown in FIG. 6).

A subaperture of the deformable reflector 1 may be defined as an area of the deformable reflector 1 across which incident radiation is focussed onto the same field position (i.e. the same position on the substrate W). A distance between the deformable reflector 1 and the field plane 4 may determine in part an overlap of subapertures of the deformable reflector 1. The deformable reflector 1 is located proximate a field plane 4. That is, the deformable reflector 1 is located at a distance from the field plane 4 such that a subaperture at the centre of the array of actuating elements does not overlap with a subaperture at an edge of the array of the actuating elements. The deformable reflector 1 may be configured such that, for example, a subaperture of the deformable reflector 1 has a diameter of about 50 mm. The deformable reflector 1 may be proximate multiple field planes.

A patterned radiation beam PB entering the projection system PL may interact with other optical elements (not shown in FIG. 6) before being incident on the deformable reflector 1. The radiation PB reflects from the deformable reflector 1 and is incident upon a reflector 5. The radiation PB reflects from the reflector 5 (which optionally may comprise a second deformable mirror) and may then interact with other optical elements in the projection system PL before exiting the projection system PL and being incident on a substrate W held by a substrate table WT. Other arrangements of the deformable reflector 1 are possible. Actuation of the deformable reflector 1 may occur during projection of the patterned radiation beam PB. Alternatively, actuation of the deformable reflector 1 may occur before projection of the patterned radiation beam PB and the portions of the deformable reflector 1 may be held in their new positions during projection of the patterned radiation beam PB. The deformable reflector 1 may be used in combination with other optical element manipulators present in the projection system PL to correct for a lithographic error.

More detail on this deformable reflector can be found in WO2018/134010.

It is proposed herein to use the deformable reflector in a control strategy which actively reduces a dynamic component such as MSD; for example in a case where high frequency overlay control is needed. By reducing MSD, there will be greater scope for overlay correction leading to a better overlay control (e.g., smaller overlay error).

In addition to typical overlay data based (high frequency) control, also alignment data based stage and/or lens manipulator control is in scope of the invention. Typically overlay data comprises densely measured position data (position delta between at least two layers applied to the substrate) which allows stage control having a high spatial resolution. Alignment data based on measurements on alignment marks distributed across the substrate may however also be densely measured and hence allowing also stage control at a high spatial resolution giving also rise to the usage of a stage control profile which will likely induce a significant amount of dynamic stage position errors (or error variation). Hence the embodiments as disclosed in this document equally apply to control profile generation based on position data associated with overlay, alignment and (when focus performance is relevant) level sensor data.

The proposed method comprises co-determining (e.g., co-optimizing) lithographic control parameters (e.g., in particular stage control parameters relating to wafer stage/reticle stage control, but also other parameters such as lens control parameters) with one or more deformable reflector control parameters relating to control of this deformable reflector or half-dome mirror element. In this way, the MA correction capability of the stages can be improved without additional MSDy impact. An output of the method may comprise improved trajectories/profiles to be sent to the stages and deformable reflector.

The deformable reflector can achieve an MSD reduction by optimizing dynamic adjustment of the a geometrical deformation, such a magnification in the y-direction, so as to reduce the average (e.g., RMS) deviation of the Y-position of an imaged feature with respect to a nominal position across the total scan integration time, while maintaining a fixed average position. Stage Y control is still needed to provide the actual overlay or alignment correction which is based on actual MA control (actively shift the centre of feature image).

Alternatively the stage control parameters (stage control profile) may be determined based on the required correction of obtained position parameter (overlay, alignment or levelling data based) data and knowledge of the correction potential of the lens manipulator in stabilizing or mitigating the contrast degradation due to the application of said control profile to correct the position.

Alternatively the lens manipulator control profile may be determined based on knowledge of the stage control profile, for example when the position parameter data is available and an expected stage control profile may be calculated and subsequently the lens manipulator control profile may be determined such as to mitigate or stabilize the image contrast degradation as induced by the dynamic stage position errors made when using the stage control profile in controlling the stage.

The new proposals may, optionally, comprise a Wiener based method (Wiener based fading control methods are described in published Netherlands application NL2021296A, which is incorporated herein by reference). Such a Wiener based method comprises taking into account the known finite slit width (the slit dimension in the scan direction) when determining the correction profile. This may comprise deconvolving the effect of the slit width (e.g., the intensity profile within the slit) from the correction profile, using an appropriate scheme, to determine a deconvolved correction profile which provides improved performance during exposure. This might comprise using a Wiener Filter based algorithm to address the fading issue, when determining the correction profiles and defining scanner actuators trajectories. This optimizes MA performance, overlay performance, focus performance, and MSD performance, and therefore imaging performance. The proposed technique can also be made flexible in terms of MA versus MSD balance for specific applications.

Fading can be related to a convolution with intensity profile within the slit. The problem can also be generalized for noise injected in the desired corrections. A convolved noisy correction profile y comprises the input correction profile or setpoints s convolved with slit intensity profile h to obtain noise-free convolved correction profile r which is subject to an injection of noise n. Only the (noisy) convolved correction profile y and slit intensity profile h are known. The aim is to deconvolve the slit profile by determine a "deslitting" or deconvolution profile g which minimizes the difference (e.g., minimizes the mean-squared error or RMS error) between corrected (or "deslitted") correction profile or setpoints $\hat{s}$ and input correction profile s, given the slit intensity profile h and convolved noisy correction profile y. Where the convolved noisy correction profile y is the available correction (as is the case here), then the problem becomes estimating the deslitted correction profile $\hat{s}$ that, if actuated, would minimize the slit convolution error. In the presence of noise, the variables are random variable, and therefore the expected value of deconvolution profile g may be taken to be:

$$g = \text{argmin } E(s-\hat{s})^2$$

A Wiener filter can be used to solve this problem. The Wiener filter is a technique used in signal processing to extract a desired signal out of an observed noisy process. The Wiener filter can be used, for instance, to recover an image which is blurred by a known low-pass filter. The Wiener filtering executes an optimal trade-off between inverse filtering and noise smoothing. This solves the problem in the frequency domain by taking the Fourier transform or FFT of each of the variables. This simplifies the solution as the convolution now becomes a multiplication. The problem becomes:

$$G(f) = \text{argmin } E|S(f) - \overline{S(f)}|^2$$

which can be solved by:

$$G(f) = \frac{H^*(f)S_{PSD}(f)}{|H(f)|^2 S_{PSD}(f) + N_{PSD}(f)}$$

where $S_{PSD}(f)$ is the mean power spectral density of the original correction profile s, $N_{PSD}(f)$ is the mean power spectral density of the noise n and the superscript * denotes a complex conjugation. As such, a Wiener filter can be used to provide deconvolved, corrected (deslitted) setpoints ŝ for the actuators in the scanner.

A noise $N_{PSD}(f)$ term may be used to tune the optimization between MA and MSD. In an embodiment, the noise term $N_{PSD}$ may be assumed to take a single value (white noise) over all frequencies $f$. A lower value for the noise term $N_{PSD}$ will enhance MA while degrading MSD, a higher value the do the opposite.

Figure 7:
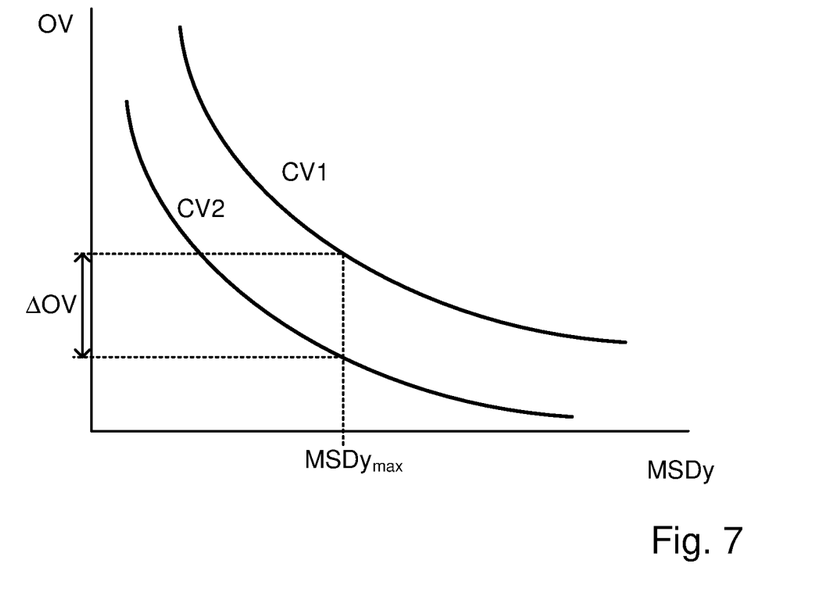
FIG. 7 is a plot of overlay residual OV against moving standard deviation MSD for a conventional method and a method according to an embodiment of the invention.

Therefore, in such an approach, the scanner currently follows overlay (e.g., dy) profiles during a scan via stage control. Fading limits the correction capability and a Wiener filter method attempts to rebalance the MA vs MSD. This is illustrated by the first curve CV1 of FIG. 7, which shows an expected overlay or alignment residual OV against induced MSD MSDy. A maximum acceptable MSD $MSDy_{max}$ is shown (which may be user-selected or otherwise calculated), which effectively places a limit on the minimum achievable overlay residual OV (best overlay), and therefore the full potential of the stage actuation, even where the scanner is physically capable of performing the stage actuation. In other words, while it may be possible to reduce MA and overlay residual further through stage corrections, this cannot be allowed due to its effect on MSD and therefore contrast and EPE.

By co-optimizing stage and deformable reflector (e.g. using the same Wiener filter method) part of the induced MSD will be compensated for in-slit by the deformable reflector, thereby enabling greater correction potential via stage actuation for a given maximum acceptable MSD $MSDy_{max}$. This is illustrated by second curve CV2 of FIG. 7 which describes the same relationship as that of curve CV1 for a co-optimized method as disclosed herein. The result of the co-optimized method and in-slit corrections using the deformable reflector is that, for the same maximum acceptable MSD $MSDy_{max}$, the overlay residual will be significantly improved, resulting in a significant overlay improvement ΔOV.

In an embodiment, the co-optimization may comprise minimizing a set of objective functions:

$$\min \begin{cases} \hat{S}(t \otimes \Omega) - dy \\ \hat{L}\ell + \sqrt{t^2 \otimes \Omega - t^2} \\ \ell \otimes \Omega \end{cases}$$

where dy is the overlay dy profile, Ŝ is the stages actuation matrix, L̂ is the lens actuation matrix, t is the stage trajectories, $\ell$ is the lens trajectories and Ω is the slit profile.

The lens actuation matrix L̂ comprises the deformable reflector actuation matrix (together with the other lens elements), and the lens trajectories $\ell$ comprise the deformable reflector trajectories in addition to the other lens trajectories. The slit profile Ω is a constant.

The first of these objective functions describes the optimization of MA using stage control. This optionally includes the slit profile as a reminder for the Wiener filter mechanism. The second of these objective functions describes the control of the lens elements, and in particular the deformable reflector, to maintain under control the quadratic form of the stage-induced MSD. The third of these objective functions is included to make explicit that control of the deformable reflector does not contribute to final overlay in terms of MA in slit. In this way, full use of Wiener-based stage actuation via the first objective function to compensate for the overlay (dy) profile.

The system of equations has to be minimized at the same time, so might be combined within a single large matrix system; e.g., an optimization of the form:

$$\min_x \|Ax - b\|$$

The degree of contrast (MSD) improvement depends on the degree of in-slit control enabled using the deformable reflector. A simplest implementation may comprise only y-translation (translation parameter Ty) control. Significant improvement on this can be achieved by including tilt (magnification parameter MagY) control. Beyond this, successive improvement can be achieved with curvature parameter and/or higher order (e.g., third order) in-slit control.

Figure 8:
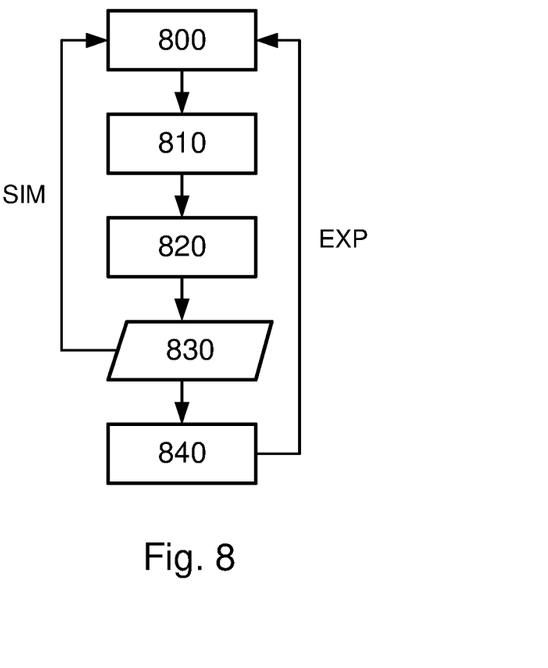
FIG. 8 is a flowchart describing a method according to an embodiment of the invention.

FIG. 8 is a flowchart illustrating the proposed approach for each layer. At step 800, the intra-die stress performance parameter (e.g., overlay) fingerprint is measured. At step 810, the maximum allowed MSD is determined based on the layer characteristics (e.g., this may be done per-layer as typically, every layer has a different sensitivity to MSD). Based on the results of steps 800 and 810, a co-optimized control strategy is determined 820 for exposing the layer, the co-optimization being performed for at least stage control and control of the deformable reflector (half-dome mirror). Optionally, the co-optimization may also comprise optimizing in term of lens control parameters. The result of step 820 will be control profiles 830, including stage control profiles, a deformable reflector control profile and (optionally) a lens control profile. These profiles 830 may be fed back SIM in a simulation based loop. Finally, at step 840, actual on-product performance may be verified (e.g., via metrology) and fed back EXP in an experimental based loop.

In this manner, it is possible to extend the correction range of overlay (or other parameter of interest) subfield corrections for a given MSD limit. Such an optimization may be performed per layer.

The co-optimized correction profile may undergo a further optimization within the scanner, e.g., based on scanner metrology (alignment/leveling etc.) or other metrology to determine the actual correction profile implemented during exposure.

In further embodiments, the co-optimization step may take into account (e.g., co-optimize) control parameters other than stage/projection lens and deformable reflector control profiles, which effect the performance parameter. For example, the co-optimized scanner control profile may be further optimized in terms of focus, dose etc., all of which also have an effect on EPE.

In all the above examples, the optimization may be performed in terms of any of the performance parameters already disclosed (overlay, EPE etc.). In an embodiment the performance parameter error is associated with stress induced by application of the subsequent layer, with the co-optimization being based on an expected performance parameter residual.

It can be shown that such an approach will result in improved overlay and therefore yield.

While the above description describes imposing a wavefront correction to correct magnification using at least one deformable reflector, it should be appreciated that a deformable reflector is only one type of lens manipulator which can be used in achieving the methods disclosed herein. It should be appreciated that the teaching herein can be extended to any other type of lens manipulator capable of achieving sufficiently fast y-magnification correction, such as a zoom lens, and all mentions of deformable reflector should be understood to encompass other lens manipulators.

Although patterning devices in the form of a physical reticle have been described, the term "patterning device" in this application also includes a data product conveying a pattern in digital form, for example to be used in conjunction with a programmable patterning device.

Further embodiments of the invention are disclosed in the list of numbered clauses below:

1. A method for determining a correction for control of a lithographic process for exposing a pattern on an exposure field using a lithographic apparatus, the method comprising:
   obtaining a spatial profile describing spatial variation of a performance parameter across at least a portion of the exposure field; and
   co-determining control profiles for the spatial profile to minimize error in the performance parameter while ensuring a minimum contrast quality, said co-determined control profiles comprising at least a stage control profile for control of a stage arrangement of the lithographic apparatus and a lens manipulator control profile for control of a lens manipulator of the lithographic apparatus operable to perform a correction for at least magnification in a direction perpendicular to the substrate plane.
2. A method according to clause 1, wherein the lens manipulator comprises one or more deformable reflectors.
3. A method according to clause 1 or 2, wherein the lens manipulator is configured for adjusting a wavefront of patterned radiation proximate an image plane of the lithographic apparatus.
4. A method according to clause 1, 2 or 3, wherein the co-optimized control profiles are determined for sub-field control.
5. A method according to clause 4, wherein said method is performed to determine respective sets of said co-determined control profiles for each sub-field of the exposure field.
6. A method according to any preceding clause, wherein said co-determined control profiles further comprise projection lens control profile for control of a projection lens within the lithographic apparatus.
7. A method according to any preceding clause, wherein ensuring a minimum contrast quality comprises imposing a maximum allowed moving standard deviation of an error in control of the stage arrangement.
8. A method according to any preceding clause, wherein said step of co-determining control profiles comprises determining co-optimized control profiles for the spatial profile to minimize error in the performance parameter while ensuring a minimum contrast quality, each of said co-determined control profiles comprising a co-optimized control profile.
9. A method according to clause 8, wherein the co-optimization comprises a moving average optimization of MA via said stage control profile and a lens optimization via said lens manipulator control profile.
10. A method according to clause 9, wherein the lens optimization aims to minimize a quadratic form of a stage-induced MSD.
11. A method according to clause 9 or 10, wherein the co-optimization comprises a function such that the lens manipulator control profile does not contribute to MA in an exposure slit of the lithographic apparatus.
12. A method according to any preceding clause, comprising applying a deconvolution scheme to at least the stage control profile, wherein the structure of the deconvolution scheme is based on a dimension of the illumination profile in the scanning direction, the at least the stage control profile comprising a convoluted control profile which is convoluted with said illumination profile as defined by an exposure slit, said deconvolution scheme deconvolving the convoluted control profile to minimize an error resultant from the convolution.
13. A method according to clause 12, wherein said deconvolution scheme comprises determining a Weiner deconvolution filter which deconvolves the convoluted control profile and illumination profile in the presence of noise.
14. A method according to any preceding clause, wherein the lens manipulator control profile comprises magnification parameter control.
15. A method according to any preceding clause, wherein the lens manipulator control profile comprises a curvature parameter.
16. A method according to any preceding clause, wherein the lens manipulator control profile comprises higher order in-slit control.
19. A method according to any preceding clause, wherein the performance parameter comprises or relates to overlay.
20. A method according to any preceding clause, wherein the performance parameter comprises edge placement error.
21. A method according to any preceding clause, wherein the stage arrangement comprises a first stage for support and positioning of a substrate and a second stage for support and positioning of a patterning device, and said stage control profile comprises one or more profiles for combined control of the first stage and second stage.
22. A method according to any preceding clause, wherein said spatial profile is derived from a known intra-die stress fingerprint.
23. A method according to any preceding clause, wherein the co-determining step comprises performing a co-determined stage control profile and lens manipulator control profile, wherein the stage control profile is configured to correct said performance parameter and said lens manipulator control profile is configured to stabilize the impact of said stage control on contrast with minimal impact on said performance parameter.
24. A method of performing co-determined stage control and dynamic lens control for control of a lithographic process for exposing a pattern on an exposure field using a lithographic apparatus, the method comprising:
co-determining a stage control profile configured to correct one or more spatially varying performance parameters and a dynamic lens control profile to stabilize the impact of said stage control on contrast with minimal impact on said one or more performance parameters.
25. A method according to clause 24, wherein said dynamic lens control profile is operable to control at least one or more deformable reflectors.
26. A method according to any preceding clause, comprising performing a lithographic process based on said co-optimized control profiles.

27. A computer program comprising program instructions operable to perform the method of any of clauses 1 to 26 when run on a suitable apparatus.

28. A non-transient computer program carrier comprising the computer program of clause 27.

29. A lithographic apparatus comprising:
   an illumination system for providing a beam of radiation;
   a stage arrangement comprising a first stage for supporting a patterning device, the patterning device serving to impart the radiation beam with a pattern in its cross-section and a second stage for holding a substrate;
   a projection system for projecting the patterned radiation beam onto a target portion of the substrate;
   a lens manipulator configured to impose a correction on the patterned radiation beam in accordance with a lens manipulator control profile, the lens manipulator being located proximate a field plane; and,
   a controller configured to perform the method of any of clauses 1 to 26.

30. A lithographic apparatus according to clause 29, wherein the lens manipulator comprises one or more deformable reflectors, configured to reflect the patterned radiation beam and impose a wavefront adjustment thereon in accordance with the lens manipulator control profile, so as to impose said correction.

31. A method of determining a dynamic control profile for a manipulator of a lens within a lithographic apparatus used in projecting an image of a pattern to a substrate, the method comprising: obtaining a spatial variation across at least a part of the substrate of a position parameter associated with the positioning of the projected image; and determining the dynamic control profile for the manipulator based on a desired stabilization or mitigation of image contrast degradation due to the expected impact of a dynamic stage position error associated with a stage control profile configured to correct the spatial variation of the position parameter.

32. The method of clause 31, wherein the position parameter is associated with alignment data and/or overlay data obtained from measurements performed on the substrate.

33. A method according to clause 31 or 32, wherein the dynamic stage position error is expressed as a moving standard deviation of a position error made during control of the stage.

34. A method of any of clauses 31 to 33, wherein the dynamic control profile for the manipulator is configured to provide dynamic control of a magnification in a direction parallel to a direction of scanning.

35. A method of determining a stage control profile for a stage within a lithographic apparatus used in projecting an image of a pattern to a substrate, the method comprising:
   obtaining a spatial variation across at least a part of the substrate of a position parameter associated with the positioning of the projected image; and
   determining the control profile for the stage based on the spatial variation of the position parameter and a correction potential of a lens manipulator used in stabilizing or mitigating image contrast degradation due to the expected impact of a dynamic stage position error associated with the stage control profile configured to correct the spatial variation of the position parameter.

36. The method of clause 35, wherein the position parameter is associated with alignment data and/or overlay data obtained from measurements performed on the substrate.

37. A method according to clause 35 or 36, wherein the dynamic stage position error is expressed as a moving standard deviation of a position error made during control of the stage.

38. A method according to any of clauses 35 to 37, wherein the correction potential of the lens manipulator is associated with a dynamically controllable magnification applied to the image in a direction parallel to a direction of scanning.

39. A method of performing co-determined stage control and dynamic lens control for control of a lithographic process for exposing a pattern on an exposure field using a lithographic apparatus, the method comprising: co-determining a stage control profile configured to correct one or more spatially varying performance parameters and a dynamic lens control profile to mitigate or stabilize the impact of said stage control on the contrast of the exposed pattern.

40. The method according to clause 39, wherein the co-determining comprises applying a constraint to the dynamic lens control profile in order to limit the impact of said dynamic lens control profile on said one or more performance parameters.

41. A method according to clause 39 or 40, wherein said dynamic lens control profile is operable to control at least one or more deformable reflectors.

42. A method according to any of clauses 39 to 41, wherein the co-determined control profiles are determined for sub-field control.

43. A method according to any of clauses 39 to 42, comprising applying a deconvolution scheme to at least the stage control profile, wherein the structure of the deconvolution scheme is based on a dimension of the illumination profile in the scanning direction, the at least the stage control profile comprising a convoluted control profile which is convoluted with said illumination profile as defined by an exposure slit, said deconvolution scheme deconvolving the convoluted control profile to minimize an error resultant from the convolution.

44. A computer program comprising program instructions operable to perform the method according to any of clauses 31 to 43 when run on a suitable apparatus.

45. A non-transient computer program carrier comprising the computer program of clause 44.

46. A method of determining a dynamic control profile for a manipulator of a lens within a lithographic apparatus used in projecting an image of a pattern to a substrate, the method comprising:
   obtaining a spatial variation across at least a part of the substrate of a position parameter associated with the positioning of the projected image; and
   determining the dynamic control profile for the manipulator based on a desired stabilization or mitigation of image contrast degradation due to the expected impact of a dynamic stage position error associated with a stage control profile configured to correct the spatial variation of the position parameter, wherein the dynamic control profile is configured to dynamically adjust a geometrical deformation of the projected image during the projecting.

47. The method of clause 46, wherein the geometrical deformation is a magnification in a direction parallel to a direction of scanning.

48. A method of determining a stage control profile for a stage within a lithographic apparatus used in projecting an image of a pattern to a substrate, the method comprising:
   obtaining a spatial variation across at least a part of the substrate of a position parameter associated with the positioning of the projected image; and
   determining the control profile for the stage based on the spatial variation of the position parameter and a correction potential of a dynamically controllable lens manipulator used in stabilizing or mitigating image contrast degradation due to the expected impact of a dynamic stage position error associated with the stage control profile configured to correct the spatial variation of the position parameter, wherein the dynamically controllable lens manipulator is configured to dynamically adjust a geometrical deformation of the projected image during the projecting.

49. The method according to clause 48, wherein the correction potential of the lens manipulator is associated with a dynamically controllable magnification applied to the image in a direction parallel to a direction of scanning.

50. A method of performing co-determined stage control and dynamic lens control for control of a lithographic process for exposing a pattern on an exposure field using a lithographic apparatus, the method comprising:

co-determining a stage control profile configured to correct one or more spatially varying performance parameters and a dynamic lens control profile to mitigate or stabilize the impact of said stage control on the contrast of the exposed pattern, wherein the dynamic lens control profile is configured to dynamically adjust a geometrical deformation of the exposed pattern during the exposing.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining a dynamic control profile for a manipulator of an optical element within a lithographic apparatus used in projecting an image of a pattern to a substrate, the method comprising:
   obtaining a spatial variation across at least a part of the substrate of a position parameter associated with the positioning of the projected image; and
   determining, by a hardware computer, the dynamic control profile for the manipulator based on stabilization or mitigation of image contrast degradation due to the expected impact of a dynamic stage position error associated with a stage control profile configured to correct the spatial variation of the position parameter, wherein the dynamic control profile for the manipulator is configured to dynamically adjust a geometrical deformation of the projected image during the projecting.

2. The method of claim 1, wherein the position parameter is associated with alignment data and/or overlay data obtained from measurements performed on the substrate.

3. The method according to claim 1, wherein the dynamic stage position error is expressed as a moving standard deviation of a position error made during control of the stage.

4. The method of claim 1, wherein the geometrical deformation is a magnification in a direction parallel to a direction of scanning.

5. A non-transient computer program carrier comprising a computer program therein, the computer program, when executed by an apparatus, configured to cause the apparatus to at least perform the method of claim 1.

6. The computer program carrier according to claim 5, wherein the position parameter is associated with alignment data and/or overlay data obtained from measurements performed on the substrate.

7. The computer program carrier according to claim 5, wherein the dynamic stage position error is expressed as a moving standard deviation of a position error made during control of the stage.

8. The computer program carrier according to claim 5, wherein the geometrical deformation is a magnification in a direction parallel to a direction of scanning.

9. A method of determining a stage control profile for a stage within a lithographic apparatus used in projecting an image of a pattern to a substrate, the method comprising:
   obtaining a spatial variation across at least a part of the substrate of a position parameter associated with the positioning of the projected image; and
   determining, by a hardware computer, the stage control profile for the stage based on the spatial variation of the position parameter and a correction potential of a dynamically controllable optical element manipulator used in stabilizing or mitigating image contrast degradation due to the expected impact of a dynamic stage position error associated with the stage control profile configured to correct the spatial variation of the position parameter, wherein the dynamically controllable optical element manipulator is configured to dynamically adjust a geometrical deformation of the projected image during the projecting.

10. The method of claim 9, wherein the position parameter is associated with alignment data and/or overlay data obtained from measurements performed on the substrate.

11. The method according to claim 9, wherein the dynamic stage position error is expressed as a moving standard deviation of a position error made during control of the stage.

12. The method according to claim 9, wherein the correction potential of the optical element manipulator is associated with a dynamically controllable magnification applied to the image in a direction parallel to a direction of scanning.

13. A non-transient computer program carrier comprising a computer program therein, the computer program, when executed by an apparatus, configured to cause the apparatus to at least perform the method of claim 9.

14. The computer program carrier according to claim 13, wherein the geometrical deformation is a magnification in a direction parallel to a direction of scanning.

15. A method for performing co-determined stage control and dynamic optical element control for control of a lithographic process for exposing a pattern on an exposure field using a lithographic apparatus, the method comprising co-determining, by a hardware computer, a stage control profile configured to correct one or more spatially varying performance parameters and a dynamic optical element control profile to mitigate or stabilize the impact of the stage control on the contrast of the exposed pattern, wherein the dynamic optical element control profile is configured to dynamically adjust a geometrical deformation of the exposed pattern during the exposing.

16. The method as claimed in claim 12, wherein the co-determining comprises applying a constraint to the dynamic optical element control profile in order to limit the impact of the dynamic optical element control profile on the one or more performance parameters.

17. The method as claimed in claim 12, wherein the dynamic optical element control profile is operable to control at least one or more deformable reflectors.

18. The method as claimed in claim 12, wherein the co-determined control profiles are determined for sub-field control.

19. The method as claimed in claim 15, further comprising applying a deconvolution scheme to at least the stage control profile, wherein the structure of the deconvolution scheme is based on a dimension of an illumination profile in a scanning direction, the at least the stage control profile comprising a convoluted control profile which is convoluted with the illumination profile as defined by an exposure slit, the deconvolution scheme deconvolving the convoluted control profile to minimize an error resultant from the convolution.

20. A non-transient computer program carrier comprising a computer program therein, the computer program, when executed by an apparatus, configured to cause the apparatus to at least perform the method of claim 15.

* * * * *